(12) United States Patent
Scott et al.

(10) Patent No.: US 10,998,900 B2
(45) Date of Patent: May 4, 2021

(54) RADIO FREQUENCY SWITCH

(71) Applicant: Qorvo US, Inc., Greensboro, NC (US)

(72) Inventors: Baker Scott, San Jose, CA (US);
George Maxim, Saratoga, CA (US);
Hideya Oshima, Santa Clara, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/893,827

(22) Filed: Jun. 5, 2020

(65) Prior Publication Data

US 2020/0382114 A1     Dec. 3, 2020

Related U.S. Application Data

(62) Division of application No. 16/426,241, filed on May 30, 2019, now Pat. No. 10,715,133.

(51) Int. Cl.
| | |
|---|---|
| *H03K 17/16* | (2006.01) |
| *H03H 11/28* | (2006.01) |
| *H03H 11/02* | (2006.01) |

(52) U.S. Cl.
CPC ........... *H03K 17/162* (2013.01); *H03H 11/02* (2013.01); *H03H 11/28* (2013.01); *H03K 17/161* (2013.01)

(58) Field of Classification Search
CPC .... H03K 17/162; H03K 17/161; H03H 11/28; H03H 11/02
See application file for complete search history.

(56) References Cited

U.S. PATENT DOCUMENTS

| | | |
|---|---|---|
| 7,492,209 B2 | 2/2009 | Prikhodko et al. |
| 8,461,903 B1 | 6/2013 | Granger-Jones |
| 8,786,002 B2 | 7/2014 | Kondo et al. |
| 8,922,268 B2 | 12/2014 | Madan et al. |
| 10,715,133 B1 | 7/2020 | Scott et al. |
| 2008/0079514 A1 | 4/2008 | Prikhodko et al. |
| 2008/0290928 A1 | 11/2008 | Kawakyu et al. |
| 2009/0206910 A1 | 8/2009 | Takahashi et al. |
| 2010/0069020 A1 | 3/2010 | Koya et al. |
| 2010/0225377 A1 | 9/2010 | Okashita |
| 2011/0133816 A1 | 6/2011 | Wu et al. |
| 2011/0260774 A1 | 10/2011 | Granger-Jones et al. |

(Continued)

OTHER PUBLICATIONS

Notice of Allowance and Examiner-Initiated Interview Summary for U.S. Appl. No. 14/212,831, dated Sep. 17, 2015, 9 pages.

(Continued)

*Primary Examiner* — Jung Kim
(74) *Attorney, Agent, or Firm* — Withrow & Terranova, P.L.L.C.

(57) ABSTRACT

A radio frequency switch having an N number of switch cells coupled in series is disclosed. Each of the switch cells includes a field-effect transistor (FET), wherein a source of switch cell 1 is coupled to a first port, a drain of switch cell N is coupled to a second port, and a drain of switch cell X is coupled to a source of switch cell X+1 for switch cell 1 through switch cell N. A first diode stack has a first anode coupled to the body of switch cell X and a first cathode coupled to a drain of switch cell X+1 for switch cell 1 through switch cell N−1, and a second diode stack has a second anode coupled to the body of switch cell X and a second cathode coupled to the source of switch cell X−1 for switch cell 2 through switch cell N.

5 Claims, 7 Drawing Sheets

(56) References Cited

U.S. PATENT DOCUMENTS

2014/0062575 A1  3/2014  Hurwitz
2014/0266415 A1  9/2014  Ken-et al.
2014/0335801 A1  11/2014 Bolton et al.
2017/0237432 A1  8/2017  Roy et al.

OTHER PUBLICATIONS

Non-Final Office Action for U.S. Appl. No. 16/426,241, dated Feb. 3, 2020, 7 pages.
Notice of Allowance for U.S. Appl. No. 13/426,241, dated Mar. 11, 2020, 8 pages.

RADIO FREQUENCY SWITCH

RELATED APPLICATIONS

This application is a divisional of U.S. patent application Ser. No. 16/426,241, filed May 30, 2019, now U.S. Pat. No. 10,715,133, the disclosure of which is hereby incorporated herein by reference in its entirety.

FIELD OF THE DISCLOSURE

Embodiments of the present disclosure relate to radio frequency switching circuitry.

BACKGROUND

An important electronic component of a radio frequency (RF) transceiver is a field-effect transistor (FET) that makes up stacked FET-type RF switches. An RF switch that is FET based typically needs linearity compensation to prevent generation of harmonic distortion when transmit signals are applied to the RF switch while the RF switch is in an off-state. The RF switch is effectively open while in the off-state, and the transmit signals are prevented from passing through the RF switch. However, while the RF switch is open, undesirable harmonics are generated from the transmit signals in part due to non-linear capacitance inherent to the RF switch. The undesirable harmonics pass from the RF switch and interfere with the RF transceiver's receiver circuitry.

A traditional off-state linearization network is placed in parallel with the RF switch to reduce the undesirable harmonics. While the traditional off-state linearization network does reduce the harmonic distortion when transmit signals are applied to the RF switch in the off-state, the traditional off-state linearization network takes up valuable circuit real estate because it requires external bias circuitry. Moreover, there is a growing need for RF switches to perform under hot switching conditions in which transmit-level RF signals are present at terminals of the RF switch as the RF switch transitions from the off-state to the on-state and vice versa. What is needed is an RF switch that is structured to regain valuable real estate by way of off-state linearization networks that do not require external bias circuitry and that switches reliably under hot switching conditions.

SUMMARY

A radio frequency switch comprising a first port, a second port, and an N number of switch cells coupled in series between the first port and the second port is disclosed. Each of the N number of switch cells includes a field-effect transistor (FET) having a source, a drain, a gate, and a body, wherein the source of switch cell 1 is coupled to the first port, the drain of switch cell N is coupled to the second port, and the drain of switch cell X is coupled to the source of switch cell X+1 for switch cell 1 through switch cell N, wherein N and X are counting numbers. Also included is a first diode stack having a first anode coupled to the body of switch cell X and a first cathode coupled to the drain of switch cell X+1 for switch cell 1 through switch cell N−1. Further included is a second diode stack having a second anode coupled to the body of switch cell X and a second cathode coupled to the source of switch cell X−1 for switch cell 2 through switch cell N.

In exemplary embodiments, the radio frequency switch further includes a first port diode stack coupled in parallel with the first diode stack of switch cell 1 and a second end diode stack coupled in parallel with the second diode stack of switch cell N. In additional exemplary embodiments, each switch cell also includes a diode having an anode coupled to the body and a cathode coupled to a varactor network for dynamically biasing the bodies of the switch cells.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
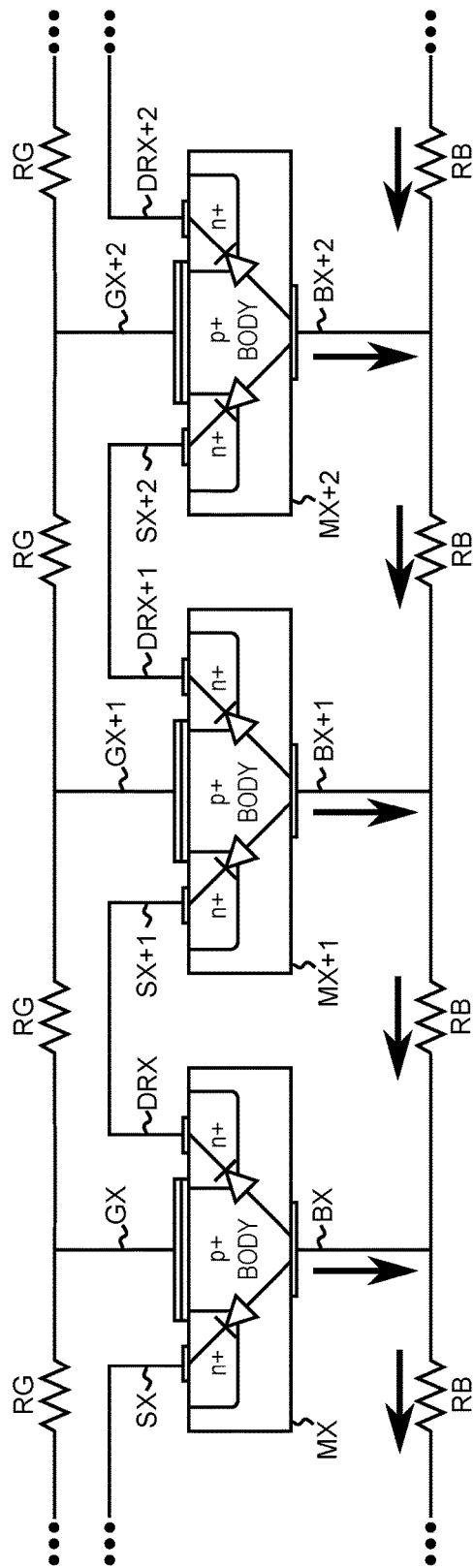
FIG. 1 is a diagram of a section of a prior-art radio frequency (RF) switch showing cross-sections of a field-effect transistors having intrinsic body diodes that generate undesirable non-linear avalanche currents.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a diagram of a section of a prior-art radio frequency (RF) switch showing cross-sections of a leftmost field-effect transistor (FET) MX, a middle FET MX+1, and a rightmost FET MX+2, wherein X is a counting number. The leftmost FET MX has a source terminal SX, a gate terminal GX, a drain terminal DRX, and a body terminal BX. The middle FET MX+1 has a source terminal SX+1, a gate terminal GX+1, a drain terminal DRX+1, and a body terminal BX+1. The rightmost FET MX+2 has a source terminal SX+2, a gate terminal GX+2, a drain terminal DRX+2, and a body terminal BX+2. The drain DRX of the leftmost FET MX is coupled to the source SX+1 of the middle FET MX+1, and the drain DRX+1 of the middle FET is coupled to the source SX+2 of the rightmost FET. The gate terminals GX, GX+1, and GX+2 are coupled to a gate bias network made up of gate resistors RG, while the body terminals are coupled to a body bias network made up of body bias resistors RB.

Beyond the physical components such as the gate resistors RG and body bias resistors RB, there are intrinsic body diodes in each of the FETS MX, MX+1, and MX+2. These intrinsic body diodes are shown symbolically in each of the cross-sections of the FETS MX, MX+1, and MX+2. Each intrinsic body diode is formed between a p+ body and an n+ source or an n+ drain. For example, the leftmost FET MX has an intrinsic diode that couples between the body terminal BX and the source terminal SX and another intrinsic diode that couples between the body terminal BX and the drain terminal DRX. At some point, as a signal voltage increases between the source terminal SX and the body terminal BX, a non-linear avalanche current begins to conduct through the reversed biased intrinsic diode between the source terminal SX and the body terminal BX. Similarly, at some point, as a signal voltage increases between the drain terminal DRX and the body terminal BX, a non-linear avalanche current begins to conduct through the reversed biased intrinsic diode between the drain terminal DRX and the body terminal BX. As shown with bold arrows, these non-linear avalanche currents exit the body terminal BX and enter into the body bias network made up of body bias resistors RB coupled to a body control terminal BC1 (not shown). Additional non-linear avalanche currents from other FETs MX+1 and MX+2 enter the body bias network, creating a cumulative non-linear avalanche current. As the cumulative non-linear avalanche current flows through the body bias resistors RB, non-linear voltages are developed that cause the biasing of the FETs MX, MX+1, and MX+2 to depart from nominal, which in turn causes harmonic distortion of source and load signals.

Figure 2:
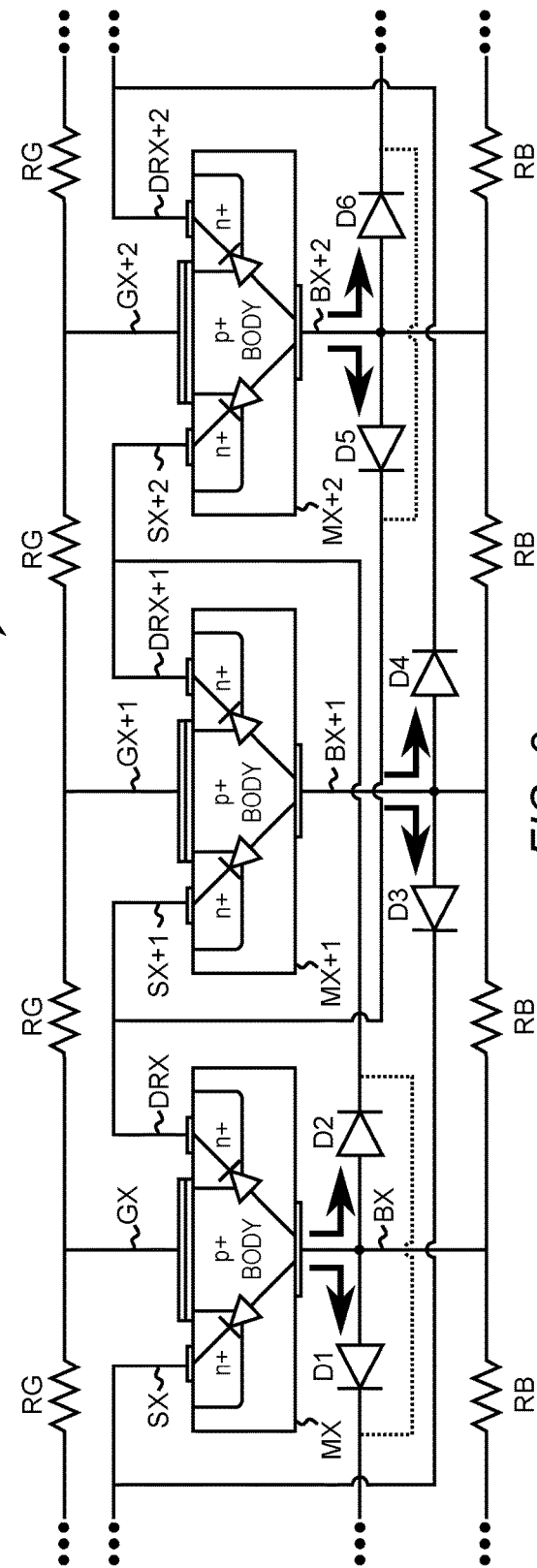
FIG. 2 is a diagram of a first exemplary embodiment of an RF switch that in accordance with the present disclosure is structured to prevent non-linear avalanche current from entering biasing networks and thus prevent harmonic distortion of source and load signals due to non-linear avalanche current from intrinsic body diodes.

FIG. 2 is a diagram of a first exemplary embodiment of an RF switch 10 that in accordance with the present disclosure is structured to prevent non-linear avalanche current from entering biasing networks and thus prevent harmonic distortion of source and load signals due to non-linear avalanche current flowing from intrinsic body diodes. In this first exemplary embodiment, a first diode D1 and a second diode D2 have anodes coupled to the body terminal BX of the leftmost FET MX to intercept non-linear avalanche current from the intrinsic body diodes of the leftmost FET MX before the non-linear avalanche current can enter the body bias network made up of the body bias resistors RB. The second diode D2 has a cathode coupled to the drain terminal DRX+1 of the middle FET MX+1 to close a current path for the non-linear avalanche current that allows the energy of the non-linear avalanche current to dissipate locally instead of entering a load or bias network. A cathode of the first diode D1 is coupled to a source of a previous FET MX−1 that is not shown in FIG. 2. However, if the leftmost FET MX is closest to a first signal port, then the first diode D1 is considered a first port diode and is coupled in parallel with the middle FET MX+1 as depicted with dashed line in FIG. 2. Similar to the coupling described for the first diode, a cathode of a third diode D3 is coupled to the source SX of the leftmost FET MX. A cathode of a fourth diode D4 is coupled to the drain DRX+2 of the rightmost FET, and a cathode of a fifth diode D5 is coupled to the source SX+1 of the middle FET MX+1. A cathode of a sixth diode D6 is coupled to a following FET MX+3 that is not shown in FIG. 2. However, if the rightmost FET MX+2 is closest to a second signal port, then the diode D6 is considered a second port diode and is coupled in parallel with the fifth diode D5 as depicted in dashed line in FIG. 2. In some applications, capacitance of the diodes D1 through D6 cause the RF switch 10 to transition between an on-state and off-state too slowly. Therefore, the following embodiments provide faster switching times.

Figure 3A:
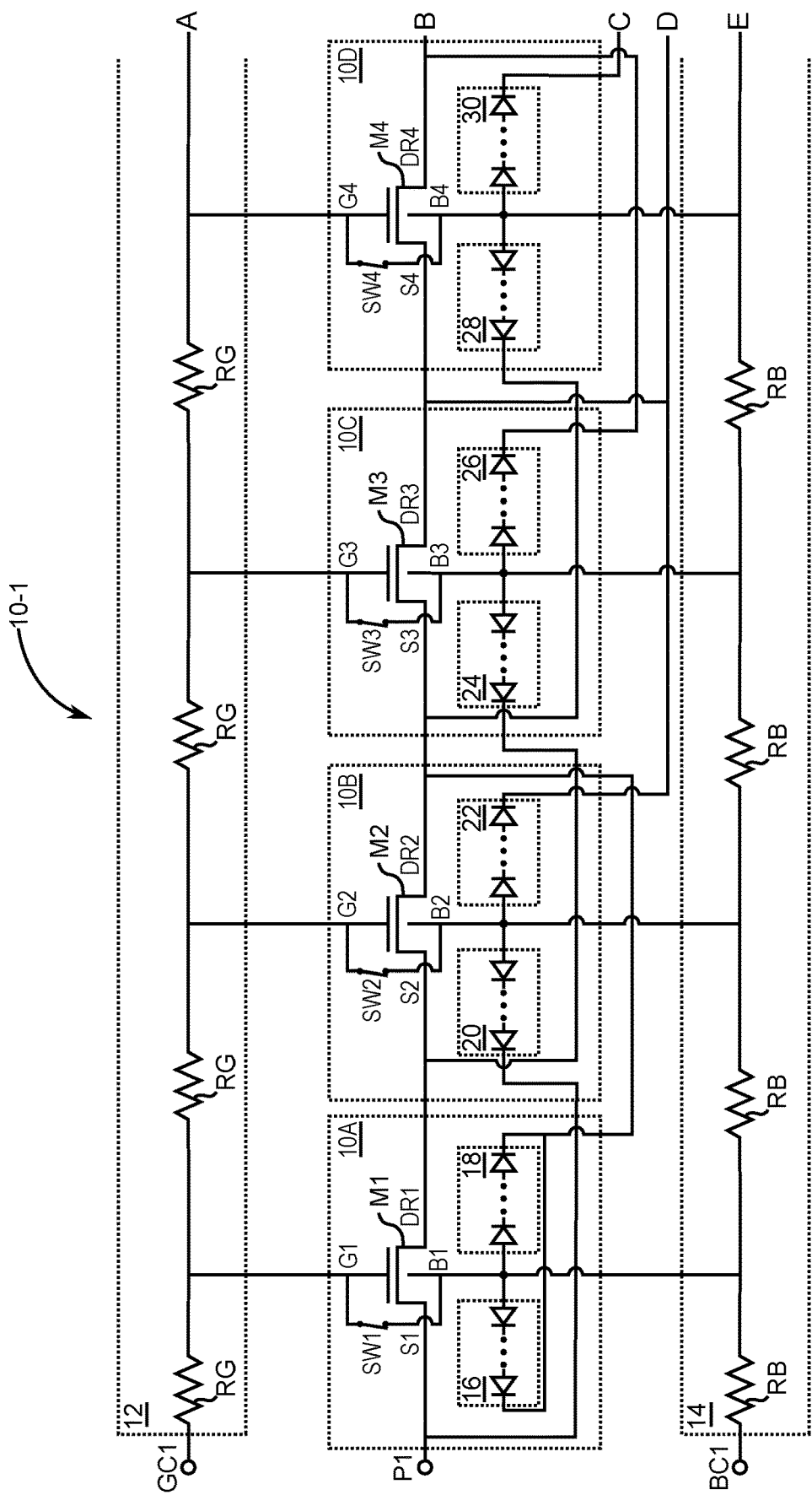
FIG. 3A is a circuit diagram of a first portion of a second embodiment of the RF switch that has faster switching times than the embodiment of FIG. 2 due to less capacitance in the non-linear avalanche current paths.
Figure 3B:
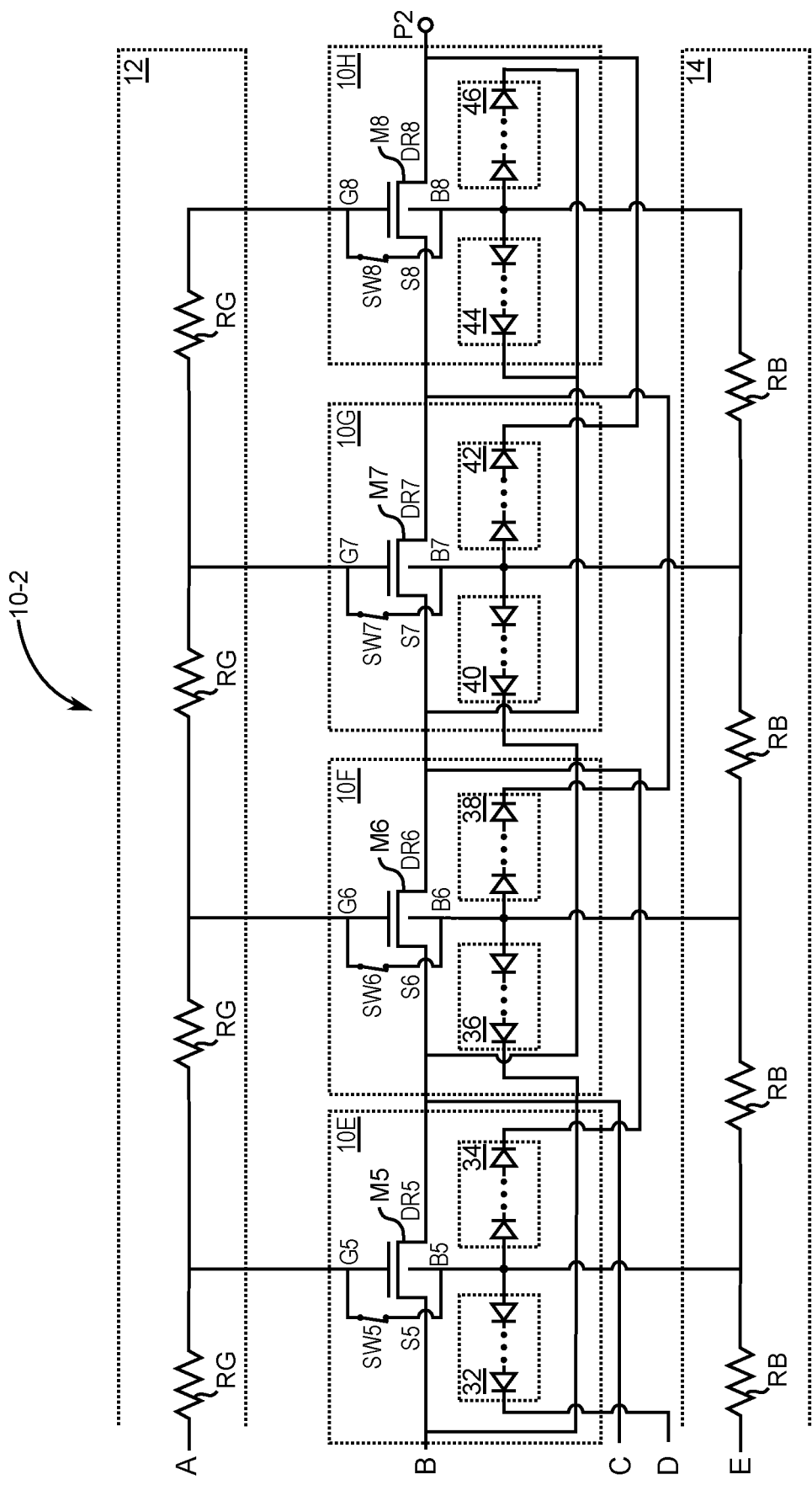
FIG. 3B is a circuit diagram of a second portion of the second embodiment of the RF switch.

In this regard, FIG. 3A and FIG. 3B are diagrams that when taken together depict a second embodiment of the RF switch 10 that has faster switching times than the embodiment of FIG. 2 due to less capacitance in the non-linear avalanche current paths. FIG. 3A depicts a first switch portion 10-1 that includes a first switch cell 10A, a second switch cell 10B, a third switch cell 10C, and a fourth switch cell 10D coupled in series.

The first switch cell 10A includes a first field-effect transistor (FET) M1 having a first gate G1 coupled to a gate bias network 12 that is made up of a series string of gate resistors RG that are coupled to a gate control terminal GC1. The first FET M1 also has a first body B1 coupled to a body bias network 14 that is made of a series string of body bias resistors RB. Further included is a first auxiliary body switch SW1 that couples the first gate G1 to the first body B1 when the RF switch 10 is in the off-state. Auxiliary body switches of this disclosure are typically FETs that are configured to close when the RF switch 10 is in an off-state and open when the RF switch 10 is in an on-state. The auxiliary body switches are typically an order of magnitude smaller than the FET M1. The first FET M1 also has a first source S1 coupled to a first RF signal port P1 and a first drain DR1.

Further included in the first switch cell 10A are a first diode stack 16 and a second diode stack 18 that each have an anode of an outermost diode coupled to the first body B1. The first switch cell 10A is unique among the second switch cell 10B, the third switch cell 10C, and the fourth switch cell 10D in that the first switch cell 10A is directly coupled to the first RF signal port P1. As such, the first diode stack 16 and the second diode stack 18 have cathodes of outermost diodes coupled together such that the first diode stack 16 and the second diode stack 18 are coupled in parallel. In this case, the first diode stack 16 is considered a first port diode stack. The first diode stack 16 and the second diode stack 18 each have at least two diodes coupled in series. However, the number of series-coupled diodes making up the first diode stack 16 and the second diode stack 18 can be greater. The number of diodes making up either of the first diode stack 16 and the second diode stack 18 is typically governed by a desired current conduction point for routing avalanche current away from the external biasing networks such as body bias network 14.

The second switch cell 10B includes a second FET M2 having a second gate G2 coupled to the gate bias network 12. The second FET M2 also has a second body B2 coupled to the body bias network 14. Further included is a second auxiliary body switch SW2 that couples the second gate G2 to the second body B2 when the RF switch 10 is in the off-state. The second FET M2 also has a second source S2 coupled to the first drain DR1 of the first switch cell 10A. The second FET M2 further has a second drain DR2, which is coupled to the cathodes of the first diode stack 16 and the second diode stack 18 of the first switch cell 10A.

Further included in the second switch cell 10B are a first diode stack 20 and a second diode stack 22 that each have an anode of an outermost diode coupled to the second body B2. A cathode of an outermost diode of the first diode stack 20 of the second switch cell 10B is coupled to the first source S1 of the first switch cell 10A.

The third switch cell 10C includes a third FET M3 having a third gate G3 coupled to the gate bias network 12. The third FET M3 also has a third body B3 coupled to the body bias network 14. Further included is a third auxiliary body switch SW3 that couples the third gate G3 to the third body B3 when the RF switch 10 is in the off-state. The third FET M3 also has a third source S3 coupled to the second drain DR2 of the second switch cell 10B. The third FET M3 further has a third drain DR3, which is coupled to the cathode of an outermost diode of the second diode stack 22 of the second switch cell 10B.

Further included in the third switch cell 10C are a first diode stack 24 and a second diode stack 26 that each have an anode of an outermost diode coupled to the third body B3. A cathode of an outermost diode of the first diode stack 24 of the third switch cell 10C is coupled to the second source S2 of the second switch cell 10B.

The fourth switch cell 10D includes a fourth FET M4 having a fourth gate G4 coupled to the gate bias network 12. The fourth FET M4 also has a fourth body B4 coupled to the body bias network 14. Further included is a fourth auxiliary body switch SW4 that couples the fourth gate G4 to the fourth body B4 when the RF switch 10 is in the off-state. The fourth FET M4 also has a fourth source S4 coupled to the third drain DR3 of the third switch cell 10C. The fourth FET M4 further has a fourth drain DR4, which is coupled to the cathode of an outermost diode of the second diode stack 26 of the third switch cell 10C.

Further included in the fourth switch cell 10D are a first diode stack 28 and a second diode stack 30 that each have an anode of an outermost diode coupled to the fourth body B4. A cathode of an outermost diode of the first diode stack 28 of the fourth switch cell 10D is coupled to the third source S3 of the third switch cell 10C.

FIG. 3B depicts a second switch portion 10-2 with labels A, B, C, D, and E that match labels A, B, C, D, and E of FIG. 3A. The second switch portion 10-2 includes a fifth switch cell 10E, a sixth switch cell 10F, a seventh switch cell 10G, and an eighth switch cell 10H coupled in series.

The fifth switch cell 10E includes a fifth FET M5 having a fifth gate G5 coupled to the gate bias network 12. The fifth FET M5 also has a fifth body B5 coupled to the body bias network 14. Further included is a fifth auxiliary body switch SW5 that couples the fifth gate G5 to the fifth body B5 when the RF switch 10 is in the off-state. The fifth FET M5 also has a fifth source S5 coupled to the fourth drain DR4 of the fourth switch cell 10D (FIG. 3A). The fifth FET M5 further has a fifth drain DR5, which is coupled to the cathode of the second diode stack 30 of the fourth switch cell 10D (FIG. 3A).

Further included in the fifth switch cell 10E are a first diode stack 32 and a second diode stack 34 that each have an anode of an outermost diode coupled to the fifth body B5. A cathode of an outermost diode of the first diode stack 32 of the fifth switch cell 10E is coupled to the fourth source S4 of the fourth switch cell 10D (FIG. 3A).

The sixth switch cell 10F includes a sixth FET M6 having a sixth gate G6 coupled to the gate bias network 12. The sixth FET M6 also has a sixth body B6 coupled to the body bias network 14. Further included is a sixth auxiliary body switch SW6 that couples the sixth gate G6 to the sixth body B6 when the RF switch 10 is in the off-state. The sixth FET M6 also has a sixth source S6 coupled to the fifth drain DR5 of the fifth switch cell 10E. The sixth FET M6 further has a sixth drain DR6, which is coupled to the cathode of the second diode stack 34 of the fifth switch cell 10E.

Further included in the sixth switch cell 10F are a first diode stack 36 and a second diode stack 38 that each have an anode of an outermost diode coupled to the sixth body B6. A cathode of an outermost diode of the first diode stack 36 of the sixth switch cell 10F is coupled to the fifth source S5 of the fifth switch cell 10E.

The seventh switch cell 10G includes a seventh FET M7 having a seventh gate G7 coupled to the gate bias network 12. The seventh FET M7 also has a seventh body B7 coupled to the body bias network 14. Further included is a seventh auxiliary body switch SW7 that couples the seventh gate G7 to the seventh body B7 when the RF switch 10 is in the off-state. The seventh FET M7 also has a seventh source S7 coupled to the sixth drain DR6 of the sixth switch cell 10F. The seventh FET M7 further has a seventh drain DR7, which is coupled to the cathode of the second diode stack 38 of the sixth switch cell 10F.

Further included in the seventh switch cell 10G are a first diode stack 40 and a second diode stack 42 that each have an anode of an outermost diode coupled to the seventh body B7. A cathode of an outermost diode of the first diode stack 40 of the seventh switch cell 10G is coupled to the sixth source S6 of the sixth switch cell 10F.

The eighth switch cell 10H includes an eighth FET M8 having an eighth gate G8 coupled to the gate bias network 12. The eighth FET M8 also has an eighth body B8 coupled to the body bias network 14. Further included is a eighth auxiliary body switch SW8 that couples the eighth gate G8 to the eighth body B8 when the RF switch 10 is in the off-state. The eighth FET M8 also has an eighth source S8 coupled to the seventh drain DR7 of the seventh switch cell 10G. The eighth FET M8 further has a eighth drain DR8, which is coupled to the cathode of the second diode stack 42 of the seventh switch cell 10G. The eighth drain DR8 is also coupled to a second RF signal port P2.

Further included in the eighth switch cell 10H are a first diode stack 44 and a second diode stack 46 that each have an anode of an outermost diode coupled to the eighth body B8. The eighth switch cell 10H is unique among the fifth switch cell 10E, the sixth switch cell 10F, and the seventh switch cell 10G in that the eighth switch cell 10H is directly coupled to the second port P2. As such, the first diode stack 44 and the second diode stack 46 of the eighth switch cell 10H have cathodes of outermost diodes coupled together such that the first diode stack 44 and the second diode stack 46 are coupled in parallel. In this case, the second diode stack 46 is considered a second port diode stack.

While the RF switch 10 depicted in FIG. 3A and FIG. 3B has eight switch cells, it is to be understood that the RF switch 10 may have an N number of switch cells, wherein N is a counting number greater than one. In such cases, a first diode stack has a first anode coupled to the body of a switch cell X and a first cathode coupled to a drain of a switch cell X+1 for switch cell 1 through switch cell N−1, and a second diode stack has a second anode coupled to the body of the switch cell X and a second cathode coupled to a source of a switch cell X−1 for switch cell 2 through switch cell N.

Figure 4A:
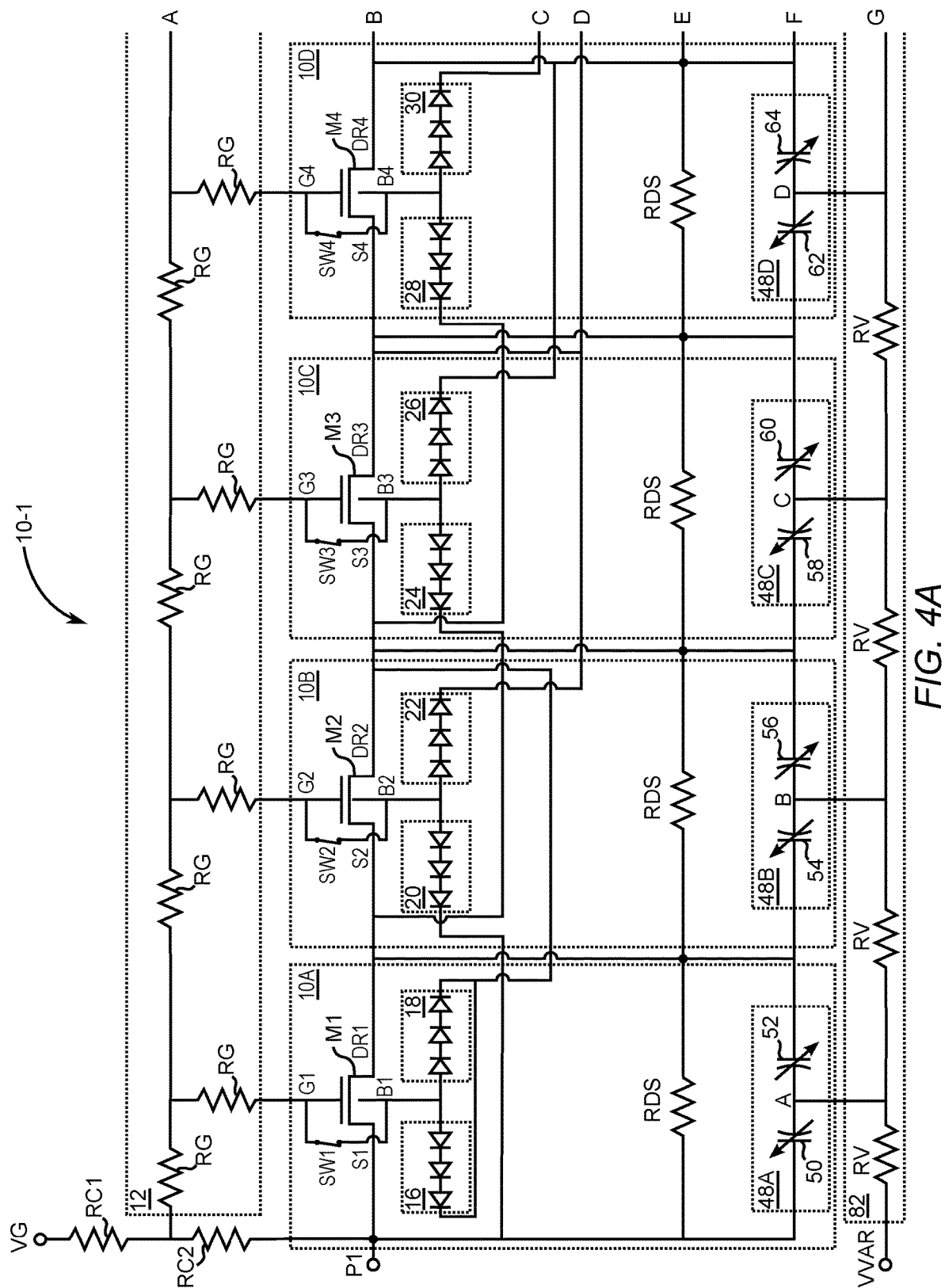
FIG. 4A is a circuit diagram of a first portion of a third embodiment of the RF switch that includes enhanced biasing and linearization.
Figure 4B:
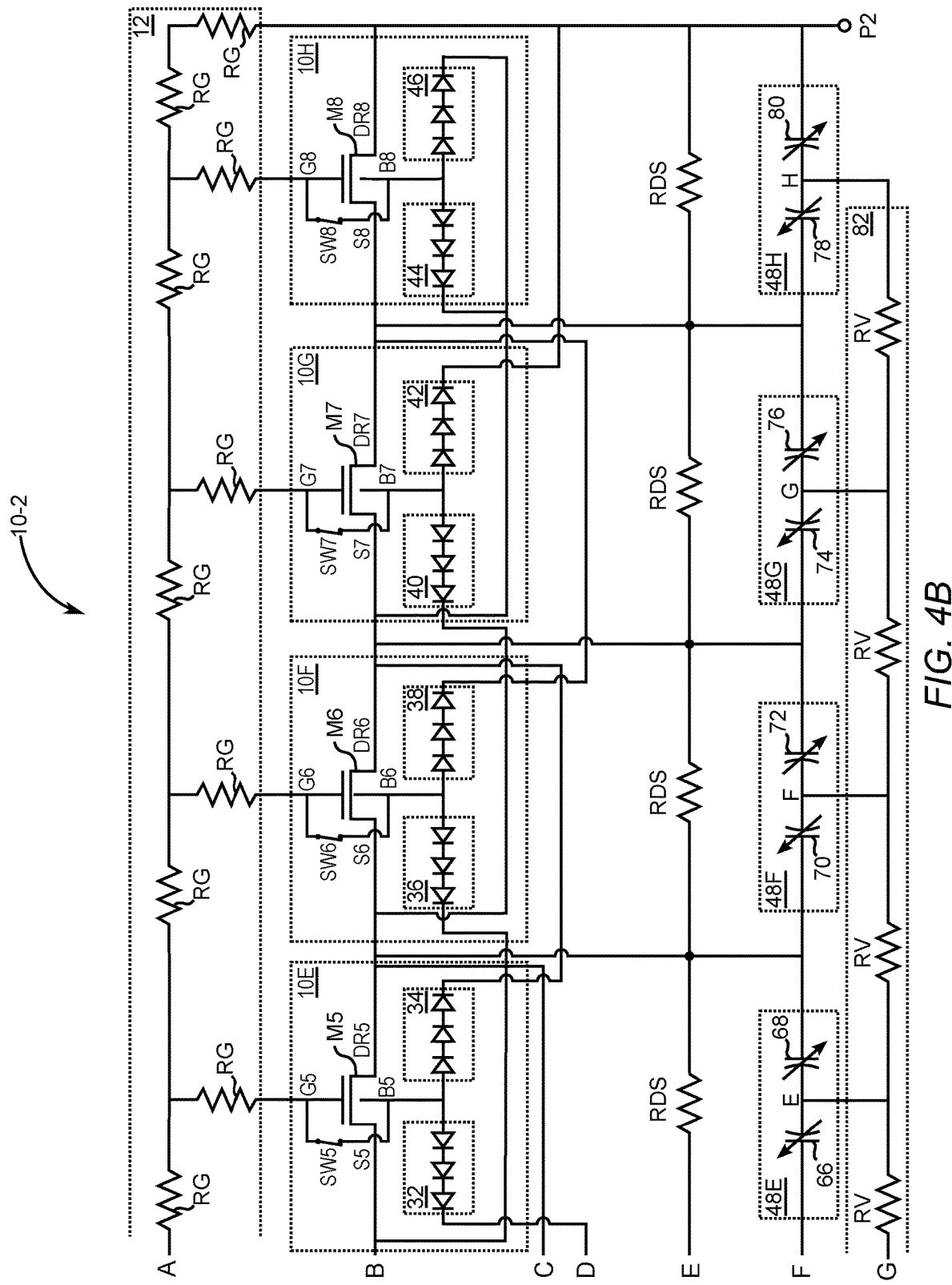
FIG. 4B is a circuit diagram of a second portion of the third embodiment of the RF switch.

FIG. 4A is a circuit diagram of a first portion 10-1 of a third embodiment of the RF switch 10 that includes enhanced biasing with linearization. FIG. 4B is a second portion 10-2 of the third embodiment of the RF switch 10. Taken together, FIG. 4A and FIG. 4B depict the gate bias network 12 further including additional gate resistors RG configured into a ladder network to more evenly distribute voltage that is applied to the gates G1 through G8. A first common resistor RC1 is coupled between a switch control terminal VG and the gate bias network 12. A second common resistor RC2 is coupled between the first common resistor RC1 and the first RF signal port P1. The RF switch 10 transitions to the on-state when a positive voltage such as +2.5 V is applied to the switch control terminal VG. The RF switch 10 transitions to the off-state when a negative voltage such as −2.5 V is applied to the switch control terminal VG.

Moreover, each of the switch cells 10A through 10H is expanded to further include a drain-to-source resistor RDS coupled across corresponding ones of the FETs M1 through M8 from drain-to-source to make voltage distribution across the RF switch 10 more equal. For example, one drain-to-source resistor RDS is coupled across the first FET M1 by having a first end coupled to the first source S1 and a second end coupled to the first drain DR1.

Each of the switch cells 10A through 10H also includes an off-state linearization network that contributes to reducing undesirable harmonics that are generated from RF signals applied across the RF switch 10 when the RF switch 10 is in an off-state that blocks the RF signals from passing between the first RF signal port P1 and the second RF signal port P2. The undesirable harmonics are generated in part due to parasitic non-linear capacitances inherent in each of the switch cells 10A through 10H. The parasitic non-linear capacitances are attributable at least in part to drain-body and source-body diodes depicted in FIG. 1 and FIG. 2.

In the exemplary embodiment of FIG. 4A and FIG. 4B, the first switch cell 10A has a first off-state linearization network 48A that includes a first varactor 50 coupled between a first tuning node A and the first source S1, and a second varactor 52 that is coupled between the first tuning node A and the first drain DR1. The second switch cell 10B has a second off-state linearization network 48B that includes a first varactor 54 coupled between a second tuning node B and the second source S2, and a second varactor 56 that is coupled between the second tuning node B and the second drain DR2. The third switch cell 10C has a third off-state linearization network 48C that includes a first varactor 58 coupled between a third tuning node C and the third source S3, and a second varactor 60 that is coupled between the third tuning node C and the third drain DR3. The fourth switch cell 10D has a fourth off-state linearization network 48D that includes a first varactor 62 coupled between a fourth tuning node D and the fourth source S4, and a second varactor 64 that is coupled between the fourth tuning node D and the fourth drain DR4.

As depicted in FIG. 4B, the fifth switch cell 10E has a fifth off-state linearization network 48E that includes a first varactor 66 coupled between a fifth tuning node E and the fifth source S5, and a second varactor 68 that is coupled between the fifth tuning node E and the fifth drain DR5. The sixth switch cell 10F has a sixth off-state linearization network 48F that includes a first varactor 70 coupled between a sixth tuning node F and the sixth source S6, and a second varactor 72 that is coupled between the sixth tuning node F and the sixth drain DR6. The seventh switch cell 10G has a seventh off-state linearization network 48G that includes a first varactor 74 coupled between a seventh tuning node G and the seventh source terminal S7, and a second varactor 76 that is coupled between the seventh tuning node G and the seventh drain DR7. The eighth switch cell 10H has a eighth off-state linearization network 48H that includes a first varactor 78 coupled between an eighth tuning node H and the eighth source S8, and a second varactor 80 that is coupled between the eighth tuning node H and the eighth drain DR8. In some embodiments, the first varactors and the second varactors are accumulation-mode type varactor diodes. In other embodiments, the first varactors and the second varactors are inversion-mode type varactor diodes.

In this third embodiment, a varactor biasing network 82 is provided to bias the off-state linearization networks 48A through 48H. The varactor biasing network 82 is made of a series string of varactor bias resistors RV that are coupled to a control terminal VVAR (FIG. 4A). The tuning nodes A through H are coupled to the varactor biasing network 82. A voltage applied to the control terminal VVAR tunes the off-state linearization networks 48A-48H.

While the RF switch 10 depicted in FIG. 4A and FIG. 4B has eight switch cells, it is to be understood that the RF switch 10 may have an N number of switch cells, wherein N is a counting number greater than one. In such cases, a first diode stack has a first anode coupled to the body of a switch cell X and a first cathode coupled to a drain of a switch cell X+1 for switch cell 1 through switch cell N−1, and a second diode stack has a second anode coupled to the body of the switch cell X and a second cathode coupled to a source of a switch cell X−1 for switch cell 2 through switch cell N.

Figure 5A:
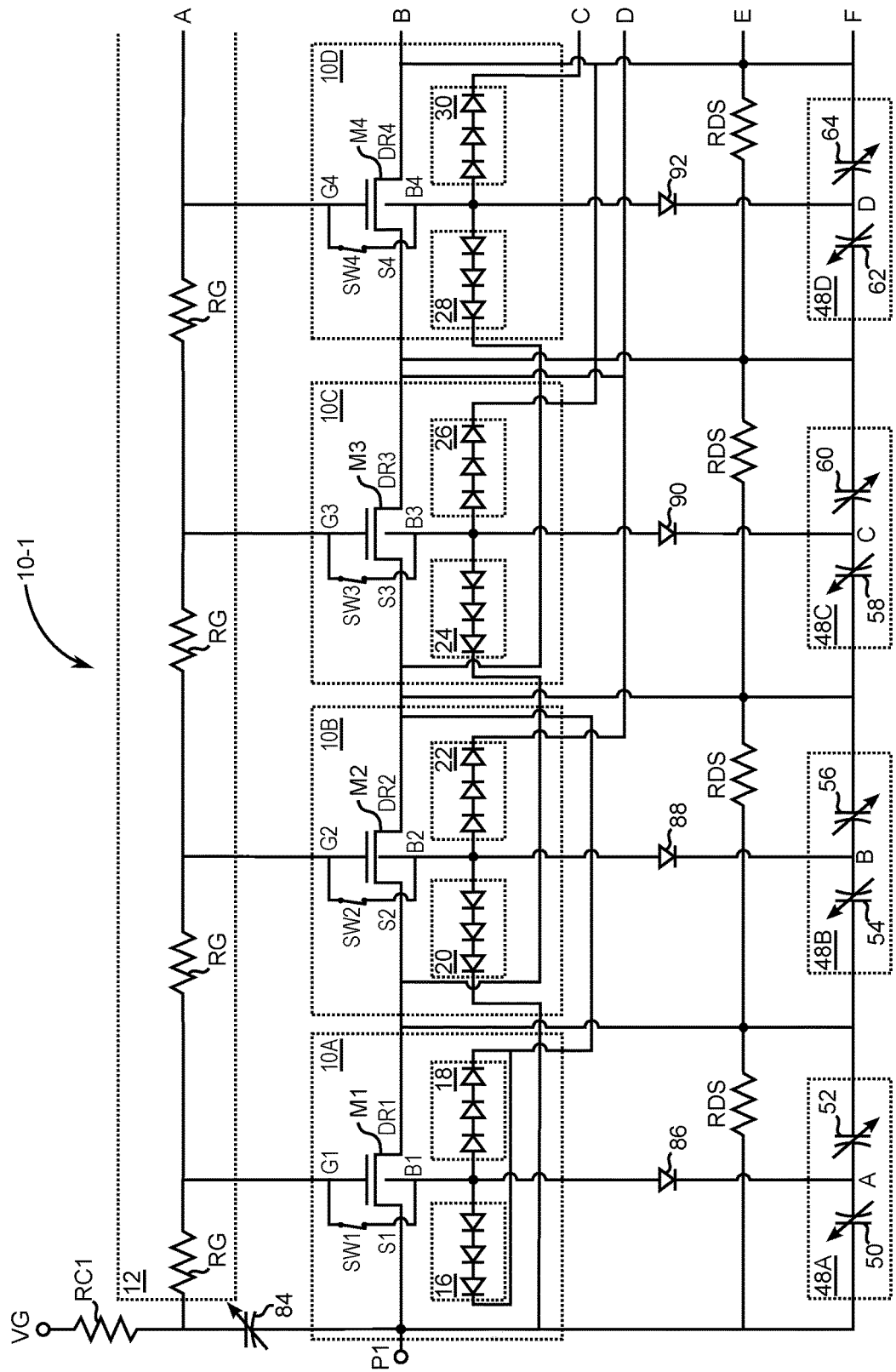
FIG. 5A is a circuit diagram of a first portion of a fourth embodiment of the RF switch that includes enhanced biasing with reduced real estate.
Figure 5B:
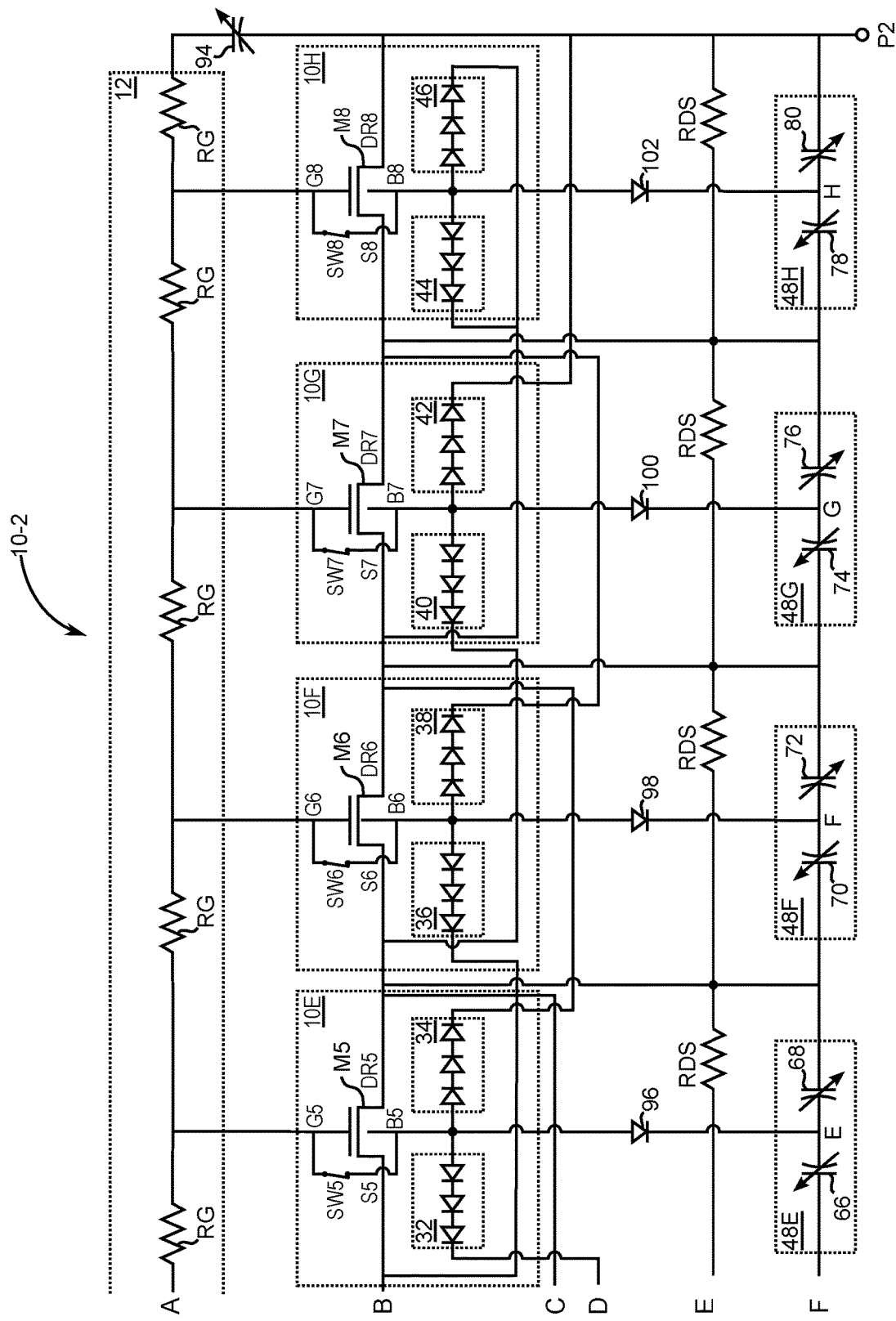
FIG. 5B is a circuit diagram of a second portion of the fourth embodiment of the RF switch.

FIG. 5A is a circuit diagram of a first portion 10-1 of a fourth embodiment of the RF switch 10 having reduced real estate while retaining enhanced biasing with linearization. FIG. 5B is a second portion 10-2 of the fourth embodiment of the RF switch 10. In FIG. 5A, a first-end varactor 84 is coupled between the common resistor RC1, the gate bias network 12, and the first RF signal port P1 to provide symmetric impedance to the first RF signal port P1.

In this fourth embodiment, the varactor biasing network 82 of FIG. 5A and FIG. 5B is not implemented. Instead, each of the switch cells 10A through 10H includes a tuner biasing component coupled between bodies of corresponding FETs M1 through M8 and the tuning nodes A through H. For example, the first switch cell 10A includes a first tuner biasing diode 86 having an anode coupled to the first body B1 and a cathode coupled to the first tuning node A. The second switch cell 10B includes a second tuner biasing diode 88 having an anode coupled to the second body B2 and a cathode coupled to the second tuning node B. The third switch cell 10C includes a third tuner biasing diode 90 having an anode coupled to the third body B3 and a cathode coupled to the third tuning node C. The fourth switch cell 10D includes a fourth tuner biasing diode 92 having an anode coupled to the fourth body B4 and a cathode coupled to the fourth tuning node D.

As shown in FIG. 5B, a second-end varactor 94 is coupled between the gate bias network 12 and the second RF signal port P2 to provide symmetric impedance to the second RF signal port P2. Moreover, the fifth switch cell 10E includes a fifth tuner biasing diode 96 having an anode coupled to the fifth body B5 and a cathode coupled to the fifth tuning node E. The sixth switch cell 10F includes a sixth tuner biasing diode 98 having an anode coupled to the sixth body B6 and a cathode coupled to the sixth tuning node F. The seventh switch cell 10G includes a seventh tuner biasing diode 100 having an anode coupled to the seventh body B7 and a cathode coupled to the seventh tuning node G. The eighth switch cell 10H includes an eighth tuner biasing diode 102 having an anode coupled to the eighth body B8 and a cathode coupled to the eighth tuning node H. While the RF switch 10 depicted in FIG. 4A and FIG. 4B has eight switch cells, it is to be understood that the RF switch 10 may have an N number of switch cells, wherein N is a counting number greater than one. In such cases, a first diode stack has a first anode coupled to the body of a switch cell X and a first cathode coupled to a drain of a switch cell X+1 for switch cell 1 through switch cell N−1, and a second diode stack has a second anode coupled to the body of the switch cell X and a second cathode coupled to a source of a switch cell X−1 for switch cell 2 through switch cell N.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency switch comprising a first port, a second port, and an N number of switch cells coupled in series between the first port and the second port, wherein N is a counting number greater than 1 and each of the N number of switch cells comprises:
    a field-effect transistor (FET) comprising a source, a drain, a gate, and a body, wherein the source of switch cell 1 is coupled to the first port, the drain of switch cell N is coupled to the second port, and the drain of switch cell X is coupled to the source of switch cell X+1 for switch cell 1 through switch cell N, wherein X is a counting number;
    a first diode having a first anode coupled to the body of switch cell X and a first cathode coupled to the drain of switch cell X+1 for switch cell 1 through switch cell N−1; and
    a second diode having a second anode coupled to the body of switch cell X and a second cathode coupled to the source of switch cell X−1 for switch cell 2 through switch cell N.

2. The radio frequency switch of claim 1 further comprising a first port diode coupled in parallel with the first diode of switch cell 1 and a second port diode coupled in parallel with the second diode of switch cell N.

3. The radio frequency switch of claim 1 wherein each switch cell further comprises an off-state linearization network coupled between the source and drain of the FET.

4. The radio frequency switch of claim 3 wherein the off-state linearization network of each switch cell comprises:
    a first varactor coupled between a tuning node and the source of the FET; and
    a second varactor coupled between the tuning node and the drain of the FET.

5. The radio frequency switch of claim 4 wherein each switch cell further comprises a tuner biasing diode coupled having an anode coupled to the body of the FET and a cathode coupled to the tuning node between the first varactor and the second varactor.

* * * * *